United States Patent [19]
Yung et al.

[11] Patent Number: 5,317,288
[45] Date of Patent: May 31, 1994

[54] CONTINUOUSLY VARIABLE ELECTRONICALLY CONTROLLED PHASE SHIFT CIRCUIT

[75] Inventors: Ming L. Yung, Los Altos; Bernard M. Albrecht, Jr., Sunnyvale; Nicholas L. Muhlhauser, Los Gatos; Stephen T. Herbusky, Santa Clara, all of Calif.

[73] Assignee: Space Systems/Loral, Inc., Palo Alto, Calif.

[21] Appl. No.: 990,903

[22] Filed: Dec. 15, 1992

[51] Int. Cl.⁵ .................... H03C 3/00; H03C 3/40; H03H 7/20
[52] U.S. Cl. .................... 332/144; 307/262; 332/146; 333/81 R; 333/139; 455/110
[58] Field of Search ............... 332/103, 104, 105, 144, 332/145, 146, 147, 148; 333/81 R, 156, 164, 139; 307/262, 551, 565, 566; 328/155; 455/42, 102, 110

[56] References Cited
U.S. PATENT DOCUMENTS 4,161,705  7/1979  Nemit et al. ............. 333/164 X
4,549,152 10/1985  Kumar .................... 333/156 X
4,862,116  8/1989  Olver .................... 332/145
4,970,519 11/1990  Minnis et al. ............ 342/165

Primary Examiner—Siegfried H. Grimm
Attorney, Agent, or Firm—Perman & Green

[57] ABSTRACT

A variable electronically controlled phase shift circuit including a phase splitter stage including a 90 degree phase divider to split an RF input signal into 0 and 90 degree components. Each split signal is further split into two pairs that are displaced in phase by 180 degrees to provide, 0 degree, 180 degree and degree, 270 degree pairs. Four signals of the signal pairs are applied to a phase controller subcircuit wherein one of each of the two signal pairs may be attenuated by a control signal. The signal pairs from the phase controller sub-circuit are then summed and the summed pairs are combined into a single output signal. The phase of the output signal is controlled by varying the relative amplitudes of at least one of the component signals of the 0 degree, 180 degree and 90 degree, 270 degree pairs by means of the control signals on the phase control sub-circuit.

8 Claims, 3 Drawing Sheets

CONTINUOUSLY VARIABLE ELECTRONICALLY CONTROLLED PHASE SHIFT CIRCUIT

FIELD OF THE INVENTION

The present invention relates to phase shift circuits, and more particularly a variable RF phase shift circuit for phase modulation communication systems.

BACKGROUND OF THE INVENTION

Phase modulation techniques are used for communication systems, and such phase modulation techniques incorporate phase shift circuits of the type wherein the phase shift is adjustable over a 360 degree range.

An example of a typical adjustable phase shifter for adjustably providing a 360 degree range of phase shift to RF signals is disclosed in U.S. Pat. No. 4,395,687 issued Jul. 26, 1983 to Belohoubek and entitled, "Adjustable Phase Shifter". In the U.S. Pat. No. 4,395,687 the RF signals are divided into three equal parts, adjusting the relative amplitudes of the parts of the RF signals and combining the three parts of the RF signals at relative phase angles of 0, 120 and 240 degrees.

In U.S. Pat. No. 4,355,289 issued Oct. 19, 1982 to Beyer et. al. and entitled "Phase Shift And Amplitude Modulator", a parallel modulator for digital phase modulation is described wherein the outputs of two amplitude controllable bi-phase modulators are combined in quadrature to form the basis for the output signal; by control of the amplitude and phase—either 0 or 180 degrees—of each of the bi-phase modulators and an output signal having an arbitrary phase angle is produced.

The parallel modulator is capable of independent phase and amplitude control and employs bi-phase modulators.

Each bi-phase modulator utilizes diodes which are always turned on so as to minimize the parasitic reactances associated with the diodes, and each bi-phase modulator includes a power splitter which splits the continuous wave carrier input signal into two intermediate signals which are equal in amplitude and 180 degrees out of phase. At microwave frequency operation, each of the two intermediate signals are coupled through directional couplers to a pair of PIN diodes which are connected together at a common summing junction.

With proper adjustment of the DC bias level, both diodes will be operated fully on, and the two microwave frequency intermediate signals conducted through the diodes will exactly cancel at the summing junction—a null condition. If the bias current provided to the diode which is conducting the intermediate signal at 0 degree phase angle is reduced from the null condition current, the intermediate signal at 180 degrees will not be completely canceled at the junction, and thus the phase of the output signal will be at 180 degrees.

The output amplitude may thereafter be continuously controlled by varying the bias current of the diode conducting the 0° intermediate signal.

Two bi-phase modulators of the Beyer patent may be combined in a parallel modulator configuration to yield a modulated output signal which, with proper control of the bias inputs to the bi-phase modulators, can be controlled to an arbitrary phase angle between 0° and 360 degrees, and to a continuously controllable amplitude.

In U.S. Pat. No. 4,549,152 issued Oct. 22, 1985 to Kumar and entitled, "Broadband Adjustable Phase Modulation Circuit, a phase modulation circuit is described which provides at an output terminal an output signal controllably shifted from 0 to 360 degrees relative to an input signal provided at an input terminal and includes a first 90 degree coupler connected between the input terminal and second and third 90 degree couplers, four gain controllable amplifiers, fourth and fifth 90 degree couplers and an in phase combiner with its output connected to the output terminal. Two of the amplifiers are connected between the second and fourth couplers. The additional amplifiers are connected between the third and fifth couplers. The fourth and fifth couplers are connected to the inputs of the in-phase combiner. The gain through the various amplifiers is adjusted to control the amount of phase shift through the circuit.

U.S. Pat. No. 4,581,595 issued Apr. 8, 1986 to Silagi entitled "Phase Shift Network With Minimum Amplitude Ripple", describes an improved phase shift network which includes a splitter for receiving an input signal and providing outputs which are coupled through all pass networks to produce signals differing in phase by predetermined angle. The signals from the all pass networks are coupled through variable attenuators having their outputs recombined in a combiner to produce an output representing the input signal phase shifted by a predetermined angle. The phase shift may be adjusted by changing only one variable attenuator at a time to produce phase shifts of 90 degrees or greater.

U.S. Pat. No. 4,870,374 issued Sep. 26, 1989 to Harris entitled "Modulator Producing Phase Modulation By Combining Amplitude Modulated Signals", describes still another system for using the modulation of the phase of a RF carrier as means of transmitting information. The RF input is split into four quadrature components each of which is passed through individual amplitude control attenuators and then summed in a combiner to create the required phase-controlled RF signal. The resultant signal is then amplified in an RF signal amplifier chain as required to achieve the desired output level. The RF output level is sampled and routed back to an in-phase splitter the output of which is compared to the corresponding individual quadrature components of the unmodulated RF signal to generate a signal which is compared with a processor generated modulation reference signal in a control loop amplifier and the resulting error signal is applied to the individual attenuators to adjust the output amplitude of each quadrature component. The quadrature components are then combined to obtain the desired phase-modulated RF output signal.

SUMMARY OF THE INVENTION

The present invention provides a variable RF phase shift circuit, and in particular a phase shift circuit for phase modulation and control of an RF signal at 650 MHz. The invention can also be used as part of a phase-array system.

The phase shift circuit of the present invention incorporates a phase splitter, a phase controller, an in-phase combiner and a post amplifier to achieve a 360° controllable phase shift of the RF signal through 360 degrees.

DETAILED DESCRIPTION OF THE PREFERRED EMBODIMENT

Figure 1:
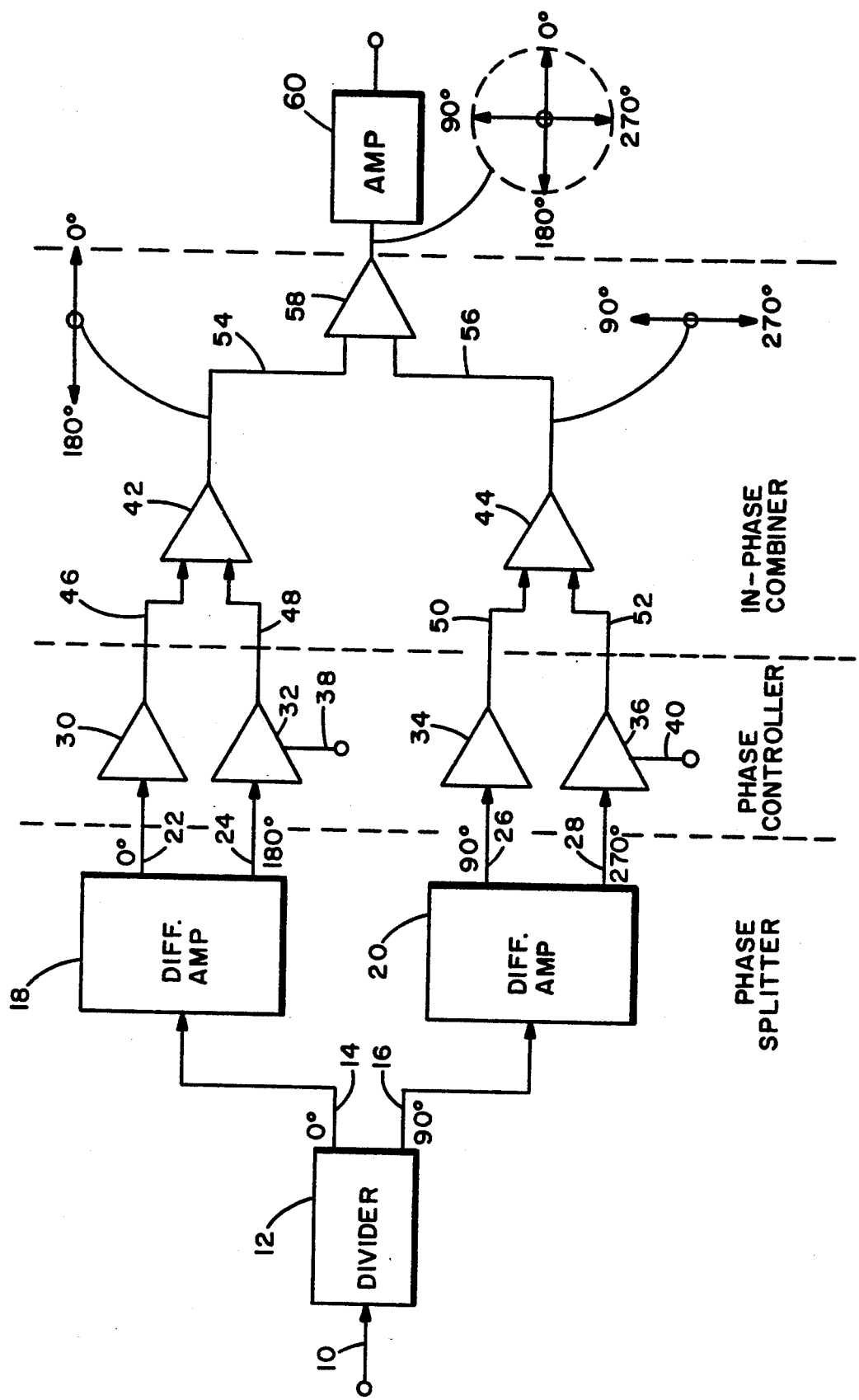
FIG. 1 is a schematic block diagram of a continuously variable phase shift circuit according to the principles of the present invention.

Referring to FIG. 1, a schematic block diagram of an embodiment of a continuously variable electronically controlled phase shift circuit is shown including a phase splitter including a 90 degree phase divider to split an RF input signal into 0 and 90 degree components. Each split signal is further split into pairs that are displaced in phase by 180 degrees to provide, 0 degree, 180 degree and 90 degree, 270 degree pairs. The two signal pairs are summed and the summed pairs are combined into a single output signal. The phase of the output signal is controlled by varying the relative amplitudes of at least one of the component signals of the 0 degree, 180 degree and 90 degree, 270 degree pairs.

More specifically, an input RF signal, which may have a frequency of 650 MHz is applied to the input lead 10 of the phase shift circuit of FIG. 1 where it is introduced into a phase splitter stage including a power divider circuit 12 which produces two equal amplitude output signals an on leads 14 and 16 which have a 90 degree phase difference. The signal on lead 14 may be at 0 degree and the signal on lead 16 may be at 90 degrees. These two signals are introduced respectively into two differential amplifiers 18 and 20 where they are each further split into two more pairs of signals with 180 degree phase differences. Thus, the 0 degree signal on lead 14 is applied to the differential amplifier circuit 18 where it is split into a 100 degree signal in lead 22 and a 100 degree signal on lead 24. Likewise, the 90 degree signal on lead 16 is applied to the differential amplifier circuit 20 where it is split into a signal on lead 26 and 28 with a 180 degree phase difference. The signal on lead 26 has a relative phase of 90 degrees and the signal on lead 28 has a relative phase 270 degrees. The combinations of the power divider circuit 12 and the differential amplifiers 18 and 20 is referred to herein as the phase splitter sub-circuit which functions to divide the input signal into four equal amplitude signals which are quadrature in phase.

The four quadrature signals on leads 22, 24, 26 and 28 are applied to a phase controller sub-circuit which includes four attenuation circuits 30, 32, 34 and 36. Attenuation circuits 32 and 36 are variable, and are controlled by control signals on leads 38 and 40. The attenuation circuits 32 and 36 may be varied to provide, for example, attenuation from 2 db to 40 db. The attenuation circuits 30 and 34 have fixed values of 8 db attenuation in this embodiment. The fixed attenuation circuits 30 and 34 receive input signals on leads 22 and 26 from circuits 18 and 20 respectively that have a 90 degree phase differential (i.e. 0 degrees and 90 degrees). The variable attenuation circuits 32 and 36 receive input signals on leads 24 and 28 from circuits 18 and 20 respectively that also have a 90 degree phase differential (i.e. 180 degrees and 270 degrees). The output signals from the phase controller sub-circuit, that is, attenuation circuits 30, 32, 34 and 36 are applied to an in-phase combiner sub-circuit which includes two stages of two-way lumped-element combiner circuits. The first combiner stage includes combiner circuits 42 and 44. Combiner circuit 42 combines the output signals from fixed attenuation circuit 30 and variable attenuation circuit 32 on leads 46 and 48 respectively. Likewise combiner circuit 44 combines the output signals from fixed attenuation circuit 34 and variable attenuation circuit 36 on leads 50 and 52 respectively.

The two input signals to combiner circuit 42 are 180 degrees apart. Also, the fixed attenuator output signal level on lead 46 is set by attenuation circuit 30 to be 50 percent lower than the maximum signal level of the variable level signal on lead 48. Thus the combining of the two signals produces a resultant output signal on lead 54 from combiner circuit 42 that can be varied by the control signal on lead 38 from a maximum in one direction (180 degrees) to a maximum in the opposite directions (0 degrees). The same is true for the signals on leads 50 and 52 which may be combined to provide a signal on lead 56 from combiner circuit 44 that can be varied by a control signal on lead 40 from a maximum in one direction (90 degrees) to a maximum in the opposite direction (270 degrees) because the signal level from fixed attenuation circuit 34 is set at 50 percent of the maximum signal level from the attenuation circuit 36.

The combined signals from combiner circuits 42 and 44 on leads 54 and 56 respectively are applied as signals to the second combiner stage, which consists of combiner circuit 58. The input signals to combiner circuit 58 on leads 54 and 56 are in quadrature with each other, and are also continuously variable from maximums in opposite directions of phase (0 and 180 degrees and 90 and 270 degrees) by the control signals of the variable attenuation circuits 32, 34. Thus, the output signal from combiner circuit 58 is a signal whose phase can be varied from 0 degrees to 360 degrees continuously. Finally, the output signal from combiner circuit 58 is applied through an amplifier stage 60 to compensate for the total signal loss that may occur in the phase shift circuit.

Figure 2:
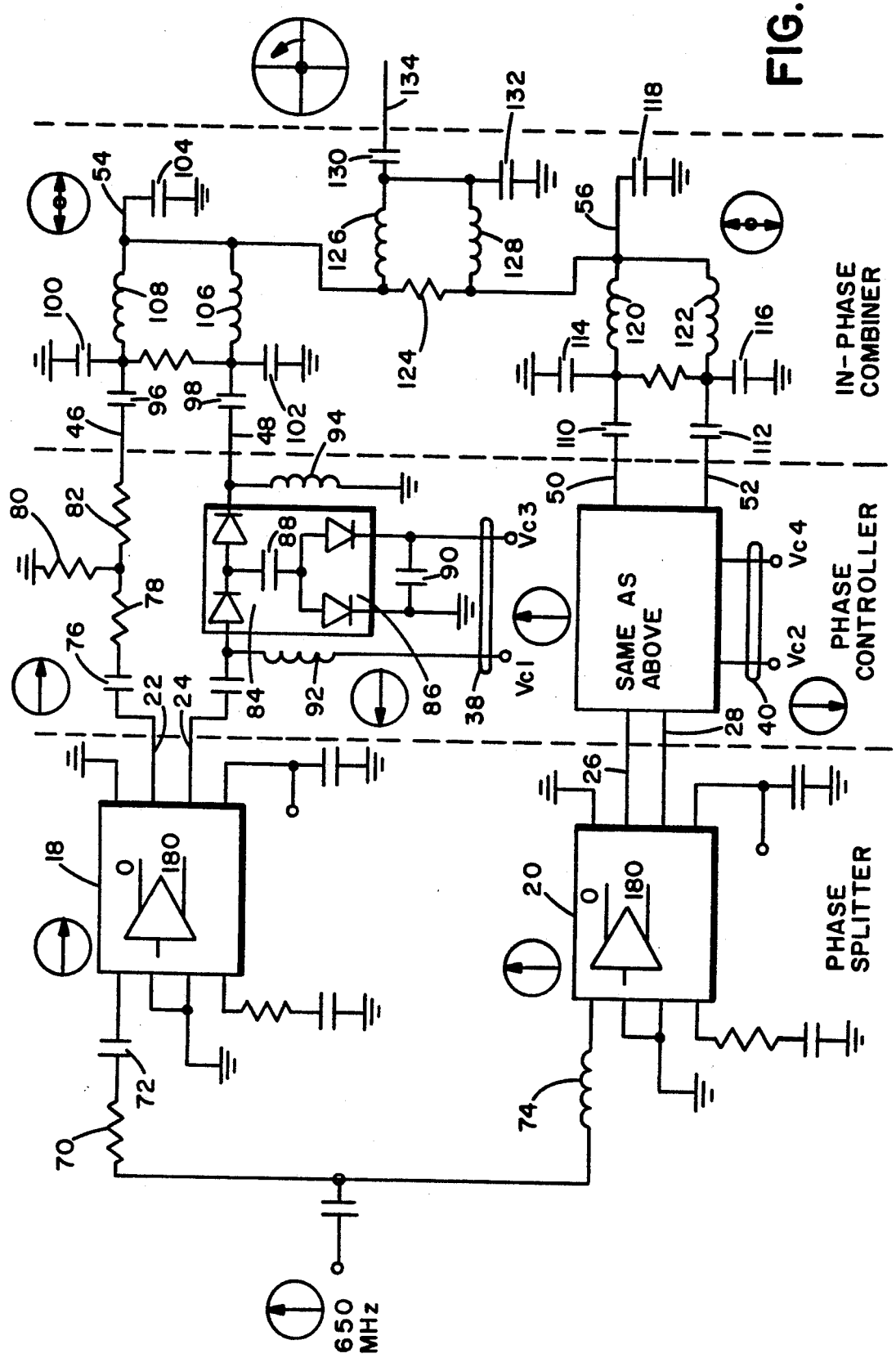
FIG. 2 is a more detailed circuit diagram of the phase shift circuit of FIG. 1.

Referring to FIG. 2, a more detailed circuit diagram is provided for the phase shift circuit illustrated in FIG. 1. In FIG. 2, the 650 MHz input signal is applied to a phase splitter circuit including a lumped element 90 degree power divider 12 including resistor 70, capacitor 72 and inductor 74. The 0 degree component signal on lead 14 is applied to a conventional variable gain amplifier 18 and the 90 degree component signal is applied to another conventional variable gain amplifier 20. As illustrated in FIG. 2 the variable gain amplifier 18 provides two equal amplitude output signals, one at 0 degrees on lead 22 and the other at 180 degrees on lead 24. Likewise, the variable gain amplifier 20 provides two equal amplitude output signals one at 90 degrees and the other at 270 degrees. The 0 degree signal on lead 22 is passed through fixed gain attenuator 30 including capacitor 76, resistors 78, 80 and 82 to provide a degree signal on lead 46. The 180 degree signal on lead 24 is applied to variable gain attenuator 32 which includes gain control input signal on leads 38. The 180 degree output signal from variable gain attenuator 32 appears on lead 48. The circuits for the fixed gain attenuator 30 and the variable gain attenuator 32 are duplicated for attenuators 34 and 36 which are responsive to the 90 degree and 270 degree signals on leads 26 and 28.

The variable gain attenuators 32 and 36 are conventional devices and include diode pairs 84 and 86, capacitors 88 and 90 and inductors 92 and 94. Control input signals are applied to lead pairs 38 to vary the amount of signal attenuation produced by attenuators 32 and 36.

The signal pairs on leads 46 and 48 are applied to LC combiner circuit 42 which includes capacitors 96, 98, 100, 102 and 104 and inductors 106 and 108.

The signal level of the fixed signal at attenuator 30 is set at the mid-point between the maximum signal level and minimum signal level produced by the attenuator 32. By adjusting the attenuator level of attenuator 32 by the control signal on lead pair 38 and combining it with the fixed level signal from attenuator 30, it is possible to produce a combined signal from combiner circuit 42 that can be varied in level from a maximum value in one direction of polarity (0 degrees) to a maximum value in the other direction (180 degrees).

LC combiner circuit 44 including capacitors 110, 112, 114, 116 and 118 and inductors 120 and 122 functions in the same way as combiner circuit 42 except that the output signal on lead 56 can be varied from a maximum level in one direction (90 degrees) to a maximum level in the opposite direction (270 degrees).

Thus, the adjustable level signals on leads 54 and 56 from combiner circuits 42 and 44 are also combined at combiner circuit 58 (which includes resistor 124, inductors 126 and 128 and capacitors 130 and 132) to provide a resultant output signal on lead 134 which can be varied in phase from 0 degrees through 360 degrees continuously.

Figure 3:
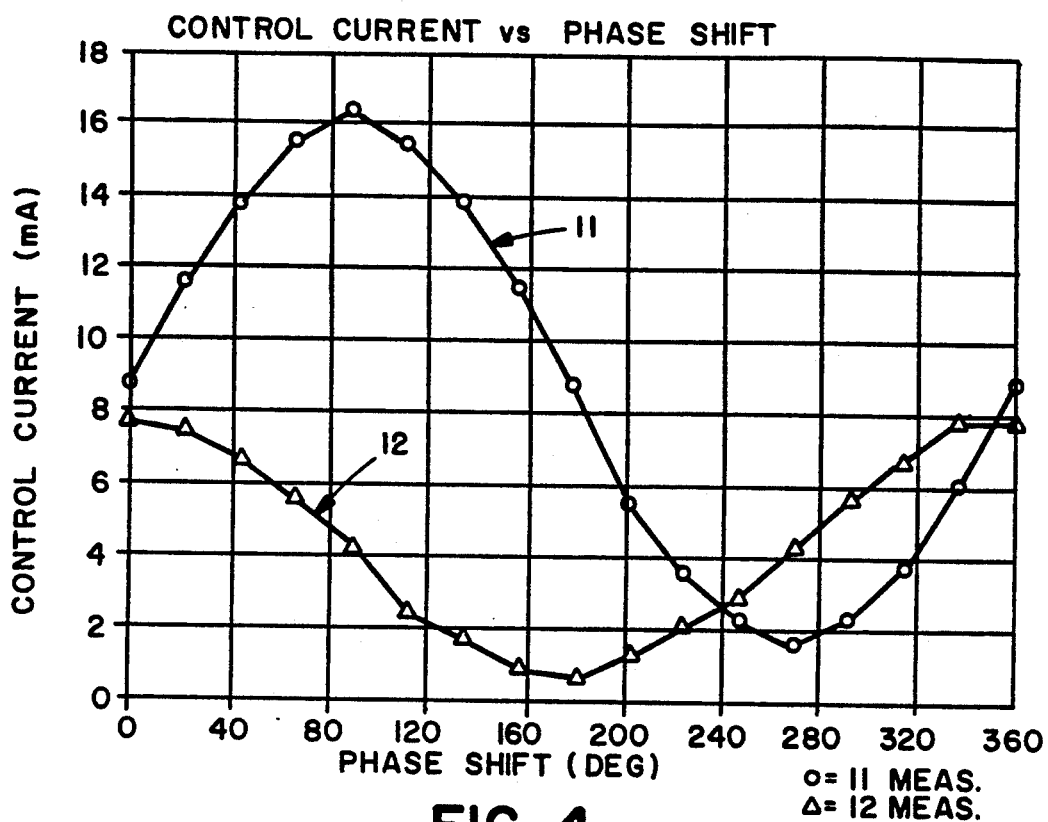
FIGS. 3 and 4 are illustrations of the waveforms of the phase shift produced by the control current in the phase shift circuit of the present invention.
Figure 4:
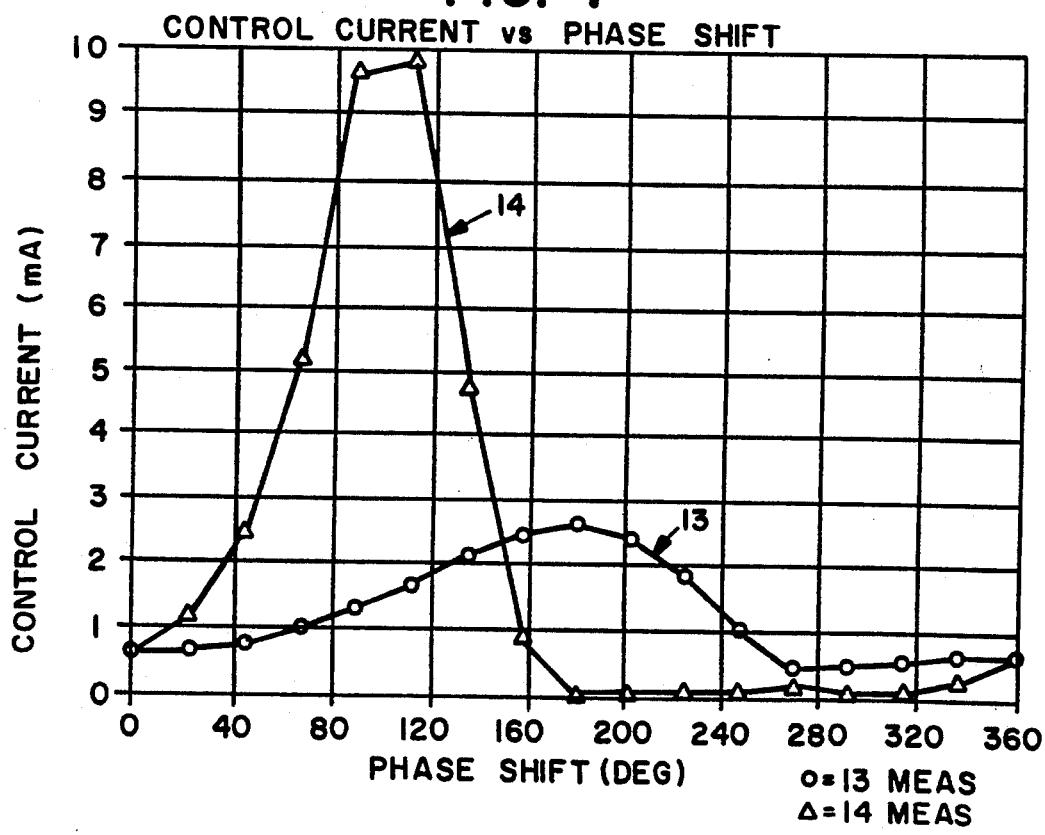

Referring to FIGS. 3, and 4 the waveforms of two typical signals are shown illustrating how the phase shift of the output signal from the phase shift circuit of FIGS. 1 and 2 can be varied in accordance with the current of the applied control signals on leads 38 and 40.

What has been described is a variable RF phase shift circuit, and in particular a phase shift circuit for phase modulation and control of an RF signal at 650 MHz which incorporates a phase splitter, a phase controller, an in-phase combiner and a post amplifier to achieve a 360° controllable phase shift of the RF signal through 360 degrees.

While the invention has been described in connection with a preferred embodiment, it is not intended to limit the scope of the invention to the particular form set forth, but, on the contrary, it is intended to cover such alternatives, modifications, and equivalence as may be included within the spirit and scope of the invention as defined in the appended claims.

We claim:

1. A phase shift circuit for providing an output signal in response to an input signal to provide an adjustable shift of the phase of said input signal over a 360 degree range comprising:

means responsive to an input signal for splitting the phase of said input signal into four separate signals that are equal in amplitude and 90 degrees out of phase with each other, an attenuation means responsive to said four separate signals for selectively attenuating at least one of said four separate signals in response to at least one applied control signal, said attenuation means including a first attenuating circuit means responsive to a first pair of said four separate signals from said splitting means, said first pair of said signals being 180 degrees out of phase with each other, for selectively attenuating one of said first pair of signals in response to a first control signal applied to said first attenuation circuit means, and a second attenuation circuit means responsive to a second pair of said four separate signals from said splitting means, said second pair of signals being 180 degrees of out phase with each other, for selectively attenuating one of said second pair of signals in response to a second control signal applied to said second attenuation circuit means, a combining means for combining said signals from said attenuation means into a single output signal having a phase shift determined by the amount of attenuation of said at least one of said separate signals with respect to the other ones of said four separate signals, said single output signal having a resultant phase that is phase shifted with respect to said input signal by a selected amount of phase within a 360 degree range as determined by said amount of attenuation, wherein said combining means includes a first combining circuit means for combining said first pair of signals from said first attenuation circuit means into one signal having a phase shift determined by the amount of attenuation of said attenuated one of said first pair of signals with respect to the unattenuated one of said pairs of signal, a second combining circuit means for combining said second pair of signals from said second attenuation circuit means into one signal having a phase shift determined by the amount of attenuation of said attenuated one of said second pair of signals with respect to the unattenuated one of said pair of signals, and a third combining circuit means responsive to said output signals from said first and second combining means for combining said signals therefrom into said single output signal having a resultant phase that is phase shifted with respect to said input signal by a selected amount of phase within a 360 degree range as determined by said amounts of attenuation, wherein said phase splitting means includes a capacitance element responsive to said input signal to said phase shift circuit for providing an output signal on a first output lead, and an inductance element responsive to said input signal to said phase shift circuit for providing an output signal on a second output lead, said output signals on said first and second output leads being 90 degrees apart in phase.

2. A phase shift circuit according to claim 1 wherein said phase splitting means further includes a first variable gain amplifier responsive to said output signal on said first output lead from said capacitance element for further phase splitting said signal into two further signals on two respective output leads wherein said two further signals are 180 degrees apart in phase, and a second variable gain amplifier responsive to said output signal on said second output lead from said inductance element for further phase splitting said signal into two further signals on two respective output leads wherein said two further signals are 180 degrees apart in phase.

3. A phase shift circuit according to claim 2 wherein said first attenuation circuit means responsive to said two further signals on said two respective output leads from said first variable gain amplifier includes a diode circuit connected to a selected one of said two respective output leads from said first variable gain amplifier, said diode circuit being responsive to said first control signal for attenuating said signal on said selected one respective output lead connected thereto.

4. A phase shift circuit according to claim 3 wherein said second attenuation circuit means responsive to said two further signals on said two respective output leads from said second variable gain amplifier includes a diode circuit connected to a selected one of said two respective output leads from said second variable gain amplifier, said diode circuit being responsive to said second control signal for attenuating said signal on said selected one respective output lead connected thereto.

5. A phase shift circuit according to claim 4 wherein said selected ones of said two respective output leads connected to said diode circuits of said first and second attenuation circuit means are leads having signals thereon 180 degree apart in phase.

6. A phase shift circuit according to claim 5 wherein said signal on said other one of said two respective output leads not connected to said diode circuit in each of said first and second attenuation circuit means has a fixed amplitude level, and wherein said diode circuit is adapted to variably attenuate said signal on said selected one of said two respective output leads by amplitude levels greater than and less than said fixed amplitude level.

7. A phase shift circuit according to claim 6 wherein said first combining means combines said fixed amplitude signal and said variable amplitude signal from said first attenuation circuit means to provide a signal having an amplitude and a phase representative of the sum of the amplitudes of said fixed and variable amplitude signals; and wherein said second combining means combines said fixed amplitude signal and said variable amplitude signal from said second attenuation circuit means to provide a signal having an amplitude and a phase representative of the sum of the amplitudes of said fixed and variable amplitude signals.

8. A phase shift circuit according to claim 7 wherein said third combining means combines said signals from said first and second combining means to provide an output signal having an amplitude and a phase representative of the sum of the amplitudes and phases of said signals from said first and second combining means, and wherein said output signal from said third combining means has a phase which is varied through 360 degrees by said amount of attenuation produced by said first and second control signals applied to said first and second diode circuits of said first and second attenuation circuit means.

* * * * *